(12) United States Patent
Holmes et al.

(10) Patent No.: US 6,748,565 B1
(45) Date of Patent: Jun. 8, 2004

(54) SYSTEM AND METHOD FOR ADJUSTING TIMING PARTS

(75) Inventors: Glenn E. Holmes, Wappingers Falls, NY (US); Timothy G. McNamara, Fishkill, NY (US); William J. Scarpero, Jr., Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 349 days.

(21) Appl. No.: 09/676,828

(22) Filed: Oct. 2, 2000

(51) Int. Cl.$^7$ ............................................... G01R 31/28
(52) U.S. Cl. ...................................... 714/731; 714/700
(58) Field of Search .................................. 714/731, 726, 714/727, 700, 744, 699; 365/233, 295; 327/150

(56) References Cited

U.S. PATENT DOCUMENTS

| | | |
|---|---|---|
| 3,761,695 A | 9/1973 | Eichelberger |
| 3,783,254 A | 1/1974 | Eichelberger |
| 3,784,907 A | 1/1974 | Eichelberger |
| 4,564,943 A | 1/1986 | Collins et al. |
| 4,852,061 A | 7/1989 | Baron et al. |
| 5,303,365 A | 4/1994 | Getzlaff et al. |
| 5,347,465 A | 9/1994 | Ferreri et al. |
| 5,463,338 A | 10/1995 | Yurash |
| 5,598,120 A | 1/1997 | Yurash |
| 5,617,426 A * | 4/1997 | Koenemann et al. ........ 714/726 |
| 5,783,960 A * | 7/1998 | Lackey ...................... 327/295 |
| 5,878,055 A | 3/1999 | Allen |
| 5,905,410 A | 5/1999 | Holmes et al. |
| 5,920,575 A * | 7/1999 | Gregor et al. .............. 714/726 |
| 5,936,977 A | 8/1999 | Churchill et al. |

OTHER PUBLICATIONS

*The IBM S/390 Integrated Server*, Jun. 27, 2000, http://www.s390.ibm.com/is (1 page); http://www.s390.ibm.com/multiprise (1 page); http://www.s390.ibm.com (2 pages); http://www.s390.ibm.com/appsource (2 pages); http://www.s390.ibm.com/software (1 page); http://www.s390.ibm.com/pes (1 page); http://tess.uspto.gov/bin/showfield?f=doc&state=isd5tk.3.2 (1 page).

* cited by examiner

Primary Examiner—Albert Decady
Assistant Examiner—Mujtaba Chaudry
(74) Attorney, Agent, or Firm—Lynn Augspurger; Cantor Colburn LLP

(57) ABSTRACT

An exemplary embodiment of the invention is a method and apparatus for configuring system cycle time in a data processing system with at least one master latch clock generating a master latch clock signal and at least one slave latch clock generating a slave latch clock signal. Timing errors are detected during system hardware testing. Adjustments to the system timing are calculated based on error for at least one of a master latch clock signal and a slave latch clock signal. The on-cycle edge of at least one of the master latch clock signal and slave latch clock signal is adjusted based on the calculations while maintaining a corresponding mid-cycle edge of at least one of the master latch clock signal and the slave latch clock signal.

11 Claims, 2 Drawing Sheets

SYSTEM AND METHOD FOR ADJUSTING TIMING PARTS

BACKGROUND OF THE INVENTION

This invention relates to the use of latch clocks during the design phase of an integrated circuit to achieve optimal integrated circuit performance for the master/slave latch design. In particular, this invention relates to adjusting system clocks allowing the machine frequency to increase, improving overall system performance and also to fix early mode timing problems that may have escaped integrated circuit timing.

In integrated circuit design, designers use latch based designs to eliminate race hazards. A circuit free of race hazards is easier to test and more reliable. In high performance computer systems, time stressing methods are used to time stress the system logic to determine the failure margins, or to detect and repair marginal or unstable errors. The stressing functions are useful in engineering, field engineering diagnostics and trouble-shooting. A technique called Level Sensitive Scan Design or LSSD is a type of scan design which uses separate system and scan clocks to distinguish between normal and test mode. Latches are often used in pairs with each latch having a normal data input, a data output and a clock. In order to perform test operations, the two latches form a master/slave pair with one scan input, one scan output and non-overlapping scan clocks which alternate. The scan in and scan out [scan] design is a technique which aims to increase the controllability and observability of the digital logic circuit by incorporating special scan registers into the circuit so that they form a scan path. For a more complete description of level sensitive logic systems and particularly system path stressing, reference is made to U.S. Pat. No. 4,564,943 issued Jan. 14, 1986 to Collins et al. and the references cited therein. The use of LSSD in digital computers has provided a minimization of race conditions, hazards and AC timing dependencies.

In the IBM® S/390® systems, for example, latch clocks are positioned so that during hardware testing, the location of the clocks chosen in the design stage can often be improved to account for differences between design assumptions and the actual "as manufactured" hardware. The differences between the "as designed" integrated circuit and the "as manufactured" integrated circuit create deviations in system performance. In the past, design methods allowed for the entire clock pulse to be moved to stress the late mode (also known as long paths) and early mode (also known as short paths) critical timing paths. However, the methods did not account for all of the critical timing paths (timings) associated with a master/slave clock system. In other words, extensive timing of the early mode and late mode timings was conducted, but because cycle times were still relatively slow, the pulse widths and the mid-cycle separation critical timing paths were set to work "as designed." The pulse width and mid-cycle separation timing paths were not considered as problems because system frequencies were relatively slow in comparison to today. There was ample pulse width to account for deviations from the "as designed" system. The pulse width was designed oversized to allow for any deviation in the slower systems. However, as the system cycle times approach Ghz frequencies, all timing paths are becoming increasingly critical. Accordingly, there remains a need for a system and method for adjusting all critical timing paths in a system using master/slave latches by independently moving critical timing paths associated with the master/slave latch design.

BRIEF SUMMARY OF THE INVENTION

An exemplary embodiment of the invention is a method and apparatus for configuring system cycle time in a data processing system with at least one master latch clock generating a master latch clock signal and at least one slave latch clock generating a slave latch clock signal. Timing errors are detected during system hardware testing. Adjustments to the system timing are calculated based on error for at least one of a master latch clock signal and a slave latch clock signal. The on-cycle edge of at least one of the master latch clock signal and slave latch clock signal is adjusted based on the calculations while maintaining a corresponding mid-cycle edge of at least one of the master latch clock signal and the slave latch clock signal.

BRIEF DESCRIPTION OF THE DRAWINGS

Referring now to the exemplary drawings wherein like elements are numbered alike in the several FIGURES.

DETAILED DESCRIPTION OF THE PREFERRED EMBODIMENTS

This invention provides a method and apparatus for testing and adjusting any of the four critical timing paths (i.e., early mode, late mode, mid-cycle early mode and clock pulse width) in a non-destructive manner without significant performance penalties to system operation, and can improve system performance in some cases. The invention is achieved by configuring the system cycle time in a data processing system after testing the system upon completion of the hardware manufacture. The results of the tests provide detected timing errors in the system. These errors are deviations from the as designed system. After detecting the error, the designer calculates an adjustment for the timing paths of the master/slave clock system. The designer independently adjusts and/or maintains the edges of any of the four critical timing paths associated with the master/slave clock system.

By allowing the independent movement of the on-cycle clock edges, the mid-cycle separation between two system latch clocks is reduced. This reduction of mid-cycle separation keeps the clock pulse widths wider and therefore allows a design to operate at higher frequencies. This improved design allows the designer to surpass the limitations of the existing designs that would otherwise require a larger mid-cycle separation. When the cycle time limiting portion of the design is discovered at the hardware test, the present invention provides complete flexibility to adjust the appropriate clock edges to achieve optimum system cycle time.

As is known in the art, there are four critical timing paths: early mode, late mode, mid-cycle early mode and clock pulse width. The early mode and late mode paths will be explained first. At the system level, data must move through combinational logic paths from one clocked storage element to another. The early mode limit and the late mode limit are critical because they limit the minimum and maximum delays respectively, of the data paths between clocked storage elements. The mid-cycle early mode and the clock pulse width timing paths are also useful in allowing the designer to improve system operation. These timing paths are described by referencing the figures.

Figure 1:
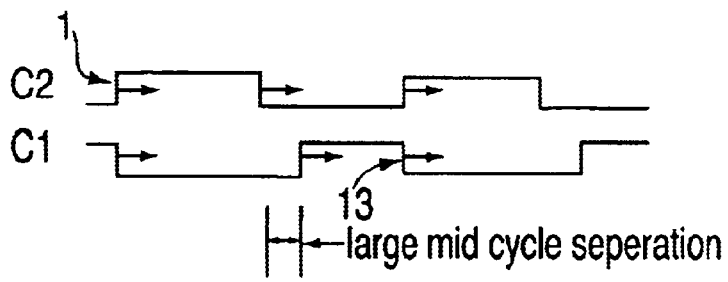
FIG. 1 is an exemplary timing diagram of a conventional master/slave configuration.

FIG. 1 is a timing diagram for a conventional master/slave latch clock design with C1 representing a master clock wave form, and C2 representing a slave clock wave form. Typically, these clocks are used with a synchronous design and the clocks launch signals (data) from one latch to another. The C2 clock launches new data on the occurrence of a C2 slave latch rising edge 1. The launched data propagates to a master latch and is captured in the master latch on the occurrence of a C1 latch clock falling edge 13. During the testing process of the hardware, system timing is evaluated to determine whether the system is operating within the designed frequency and within a certain cycle time. In the past, if the system timing needed correction, an adjustment was made to the wave form by shifting one of the clocks. Unfortunately, a shift in one edge shifted the other edge as depicted by the arrows in FIG. 1. In FIG. 1, every edge has an arrow to indicate that the whole wave form is shifting. To the detriment of the system, this method of adjustment may create additional system timing problems. For example, the late mode timing path may be benefitted by the shift, but the early mode timing path may be burdened. In other words, the minimum amount of delay needed to go beyond the master clock first falling edge may be lost. However, if the delay is not sufficient, then the launched data may get captured within the first master clock falling edge.

Figure 2:
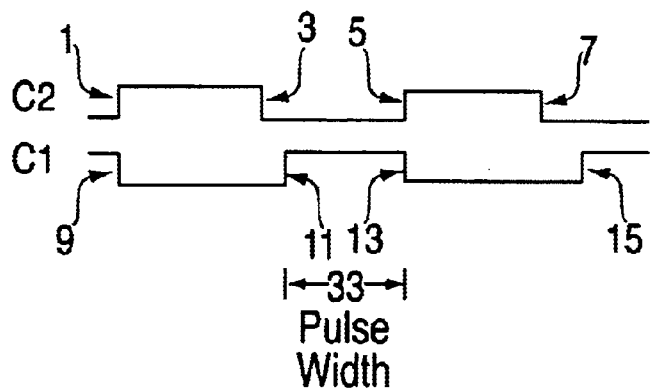
FIG. 2 is an exemplary timing diagram of the master/slave configuration of the present invention, and indicating the edges and pulse width.

FIG. 2 is a timing diagram of master and slave clock signals in an exemplary embodiment of the invention. In FIG. 2, the C2 slave clock wave form has a rising edge 1 followed by a falling edge 3 followed by a rising edge 5 and a falling edge 7. The master clock wave form C1 has an initial falling edge 9 followed by a rising edge 11 and a falling edge 13 and a rising edge 15. The data launched from rising edge 1 preferably arrives at falling edge 13 one period later. The timing from the launch of data to the arrival of data is one clock cycle or clock period. If, for example, the data was launched from slave clock rising edge 1 and arrived at master clock falling edge 9 this would be the early mode timing path. When the data is launched from edge 1 and arrives at edge 13 the timing path is the late mode timing path. The mid-cycle early mode timing path (mid-cycle separation) is the gap between the slave clock first falling edge 3 and the master clock first rising edge 11, as shown in FIG. 2. This mid-cycle separation (gap) is necessary for the master slave latch to function properly. The mid-cycle separation allows for the proper delay between the slave clock C2 and the master clock C1. This gap provides for the proper timing in the system, so that the launched data is not prematurely captured. In the past, adjusting the system timing was adjusted by shifting the edges 1, 3 and 5 with respect to the edges 9, 11 and 13. By shifting the edges, the mid-cycle separation between the master and slave latch rising and falling edges was either shortened or widened. However, if the mid-cycle separation is shortened too much, a timing failure can occur. As previously discussed, shortening the mid-cycle separation was not a great concern in the past because the system cycle frequencies were not fast enough to cause timing errors. The mid-cycle separation was designed sufficiently wide to compensate for any timing errors. If the mid-cycle gap becomes too small then there will not be sufficient space to make the proper connections between the slave clock data launch and master clock data capture.

The present invention moves the on-cycle edges 1, and /or 9 while holding fixed the mid-cycle edges 3 and/or 11. Thus, the present invention repairs an early mode timing path problem without the subsequent problems with the mid-cycle early mode timing path. Stated in another way, the mid-cycle separation (the gap between edge 3 and edge 11) does not get overly reduced.

Figure 3:
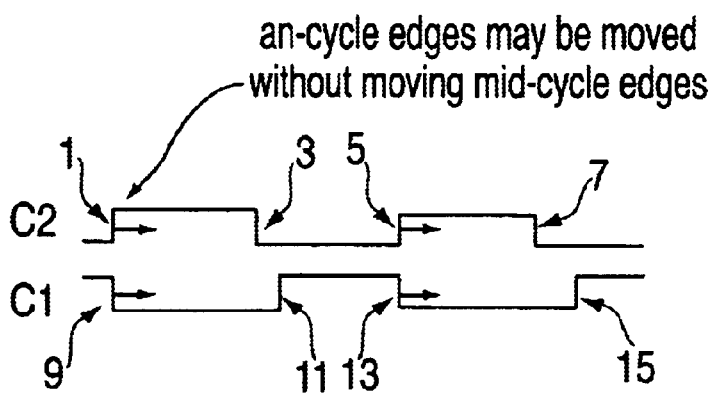
FIG. 3 is an exemplary timing diagram of the master/slave design of the present invention indicating the clock edges and reduced mid-cycle separation.

FIG. 3 further illustrates the mid-cycle separation. The gap between the edges 11 and 3 represents the mid-cycle separation. Edges 3, 7, 11 and 15 are depicted without arrows to indicate that each edge is maintained or fixed when the corresponding edges 1, 5, 9, and 13 are adjusted. Thus, the mid-cycle separation is not significantly changed, thereby preventing the problems that occurred when the entire wave form was shifted (i.e. when shortening the mid-cycle separation).

Returning to FIG. 2, the gap between the master clock edges 11 and 13 represent the clock pulse width 33. Typically, in latch clock electrical specifications the clock pulse widths must be a certain specification for the latch clocks to function properly. As circuit designs utilize higher frequencies (i.e. faster operation), the magnitude of the pulse width becomes more critical. When the mid-cycle separation is shortened, the clock pulse width increases. In other words, the larger the mid-cycle separation, the smaller the clock pulse width. If the cycle time is limited by the system cycle pulse width, then reducing the mid-cycle separation can allow for a faster system cycle time. Therefore, the greater the pulse width, the faster the system will operate. Thus, the relationship of the mid-cycle separation and the clock pulse width are important, as shown in the FIGS. 2 and 3.

Figure 4:
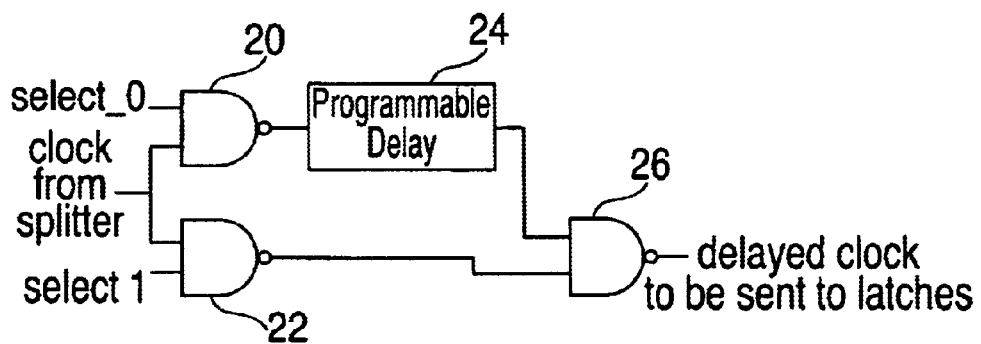
FIG. 4 is an exemplary circuit for delaying a falling edge of a clock.

FIG. 4 is a schematic diagram of an exemplary circuit for delaying the falling edge of a clock signal. Two select bits select_0 and select_1 are used to control the effect on the clock signal. The clock signal is applied to an input of a first NAND gate 20 and a second NAND gate 22. The other input of NAND gate 20 is the first select bit select_0. The other input of NAND gate 22 is the second select bit select_1. The output of first NAND gate 20 is provided to a programmable delay 24. The outputs of programmable delay 24 and NAND gate 22 are applied to NAND gate 26. Output of NAND gate 26 provides a clock signal, which may be used as clock signal C1. The operation of the circuit of FIG. 4 is summarized in the table below.

| select_0 | select_1 | clock output |
|---|---|---|
| 0 | 0 | clock off |
| 0 | 1 | normal clock |
| 1 | 0 | delay entire clock pulse |
| 1 | 1 | delay only falling edge of pulse |

Figure 5:
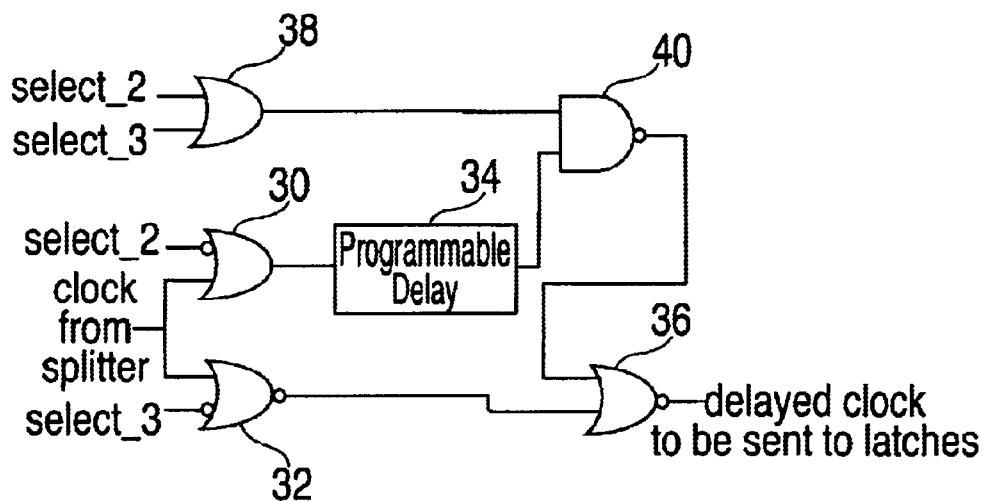
FIG. 5 is an exemplary circuit for delaying a rising edge of a clock.

FIG. 5 is a schematic diagram of an exemplary circuit for delaying the rising edge of a clock signal. Two select bits select_2 and select_3 are used to control the effect on the clock signal. The clock signal is applied to an input of a first OR gate 30 and a first NOR gate 32. The other input of OR gate 30 is the inverted first select bit select_2. The other input of NOR gate 32 is the inverted second select bit select_3. The output of OR gate 30 is provided to a programmable delay 34. First select bit select_2 and second select bit select_3 are also applied to the inputs of a second OR gate 38. The output of OR gate 38 is provided to an input of NAND gate 40. The output of programmable delay 34 is applied to the other input of NAND gate 40. The output of NAND gate 40 and the output of NOR gate 32 are applied to the inputs of a second NOR gate 36. The output of NOR gate 36 provides a clock signal, which may be used as clock signal C2. The operation of the circuit of FIG. 5 is summarized in the table below.

| select_2 | select_3 | clock output |
|----------|----------|--------------|
| 0 | 0 | clock off |
| 0 | 1 | normal clock |
| 1 | 0 | delay entire clock pulse |
| 1 | 1 | delay only rising edge of pulse |

By adjusting the delay in programmable delays 24 and 34 and controlling the values of select bits 0, 1, 2 and 3, the designer can adjust early mode, late mode, mid-cycle early mode and clock pulse width. By independently adjusting the latch clock edges, allowing some to shift and some to be fixed, the mid-cycle early mode timing path and the clock pulse width can be adjusted or maintained for the optimum system operation, thereby allowing the system to operate at higher frequencies.

While preferred embodiments have been shown and described, various modifications and substitutions may be made thereto without departing from the spirit and scope of the invention. Accordingly, it is to be understood that the present invention has been described by way of illustration and not limitation.

What is claimed is:

1. A method for configuring system cycle time in a data processing system with at least one master latch clock generating a master latch clock signal and at least one slave latch clock generating a slave latch clock signal, the method comprising:

detecting a timing error;

calculating an adjustment based on said timing error for at least one of said master latch clock signal and said slave latch clock signal; and responsive to said calculated adjustment, independent of a corresponding mid-cycle edge, adjusting an on-cycle edge of said at least one of said master latch clock signal and said slave latch clock signal while maintaining said corresponding mid-cycle edge of said at least one of said master latch clock signal and said slave latch clock signal.

2. The method of claim 1, wherein upon detecting an early mode timing problem, said on-cycle edge of said slave latch clock signal is adjusted while maintaining said corresponding mid-cycle edge of said slave latch clock signal.

3. The method of claim 1, wherein upon detecting a late mode timing problem, said on-cycle edge of said master latch clock signal is adjusted while maintaining said corresponding mid-cycle edge of said master latch clock signal.

4. The method of claim 1, wherein upon detecting a mid-cycle early mode timing problem, said on-cycle edge of said master latch clock signal is adjusted while maintaining said corresponding mid-cycle edge of said master latch clock signal and said on-cycle edge of said slave latch clock signal is adjusted while maintaining said corresponding mid-cycle edge of said slave latch clock signal.

5. The method of claim 1, wherein upon detecting a clock pulse width timing problem, said on-cycle edge of said master latch clock signal is adjusted while maintaining said corresponding mid-cycle edge of said master latch clock signal.

6. The method of claim 1, wherein upon detecting a clock pulse width timing problem, said on-cycle edge of said slave latch clock signal is adjusted while maintaining said corresponding mid-cycle edge of said slave latch clock signal.

7. An apparatus for configuring system cycle time in a data processing system, the apparatus comprising:

a master latch clock generating a master latch clock signal;

a slave latch clock generating a slave latch clock signal;

circuitry for adjusting an on-cycle edge of said master latch clock signal; and circuitry for adjusting an on-cycle edge of said slave latch clock signal;

wherein said circuitry for adjusting an on-cycle edge of said master latch clock signal and said slave latch clock signal is further configured for independent adjustment with respect to a corresponding mid-cycle edge of said master latch clock signal and said slave latch clock signal, respectively.

8. The apparatus of claim 7 wherein said circuitry for adjusting an on-cycle edge of said maser latch clock signal includes a delay for delaying a falling edge and a rising edge of said master latch clock signal.

9. The apparatus of claim 8 wherein said delay is programmable.

10. The apparatus of claim 7 wherein said circuitry for adjusting an on-cycle edge of said slave latch clock signal includes a delay for delaying a rising edge of said slave latch clock signal.

11. The apparatus of claim 10 wherein said delay is programmable.

* * * * *